(12) United States Patent
Shirai et al.

(10) Patent No.: US 6,425,771 B1
(45) Date of Patent: Jul. 30, 2002

(54) IC SOCKET

(75) Inventors: Hiroshi Shirai, Saitama; Shintaro Abe, Chiba, both of (JP)

(73) Assignee: Tyco Electronics, AMP, K.K., Kanagawa (JP)

(*) Notice: Subject to any disclaimer, the term of this patent is extended or adjusted under 35 U.S.C. 154(b) by 0 days.

(21) Appl. No.: 09/966,175

(22) Filed: Sep. 28, 2001

(30) Foreign Application Priority Data

Sep. 29, 2000 (JP) ........................ 2000-300389

(51) Int. Cl.[7] ............... H01R 12/00; H01R 13/625; H01R 4/50; H01R 13/40; H05K 1/00
(52) U.S. Cl. .................. 439/83; 439/342; 439/590
(58) Field of Search .................. 439/342, 259, 439/525, 526, 264, 68, 70, 71, 590, 83, 876

(56) References Cited

U.S. PATENT DOCUMENTS

| | | | | |
|---|---|---|---|---|
| 3,380,016 A | * | 4/1968 | Samson et al. | 339/174 |
| 4,458,968 A | * | 7/1984 | Madden | 174/52.4 |
| 4,717,346 A | * | 1/1988 | Yoshizaki | 439/331 |
| 5,144,535 A | * | 9/1992 | Megens et al. | 174/260 |
| 5,378,970 A | * | 1/1995 | Sato | 269/233 |
| 5,637,008 A | * | 6/1997 | Kozel | 439/259 |
| 5,658,160 A | * | 8/1997 | Lai | 439/259 |
| 5,791,928 A | * | 8/1998 | Lai | 439/342 |
| 5,967,841 A | * | 10/1999 | Bianca et al. | 439/590 |
| 6,152,756 A | * | 11/2000 | Huang et al. | 439/342 |

FOREIGN PATENT DOCUMENTS

| | | | | |
|---|---|---|---|---|
| DE | 4326104 A1 | * | 2/1995 | H05K/1/14 |
| GB | 2132038 A | * | 6/1984 | H01R/9/09 |
| JP | 62-37887 | | 2/1987 | H01R/9/09 |

* cited by examiner

Primary Examiner—P. Austin Bradley
Assistant Examiner—Edwin A. León

(57) ABSTRACT

An IC socket is provided which can absorb the difference in linear expansion coefficient between the housing and the circuit board, and thus prevent the occurrence of solder cracking and warping, without lowering the strength of the housing. First slits which have bottoms and which extend from the upper surface of the housing toward the undersurface of the housing are formed between specified rows of pin receiving openings which are formed in the upper surfaces of contact press-fitting accommodating holes that are arranged in the form of a matrix. These holes pass entirely through the housing from the upper surface to the undersurface. Second slits which have bottoms and which extend from the undersurface of the housing toward the upper surface of the housing are formed between specified rows of solder ball receiving cavities formed in the undersurfaces of the contact receiving cavities in positions where the first slits are not formed.

8 Claims, 6 Drawing Sheets

IC SOCKET

FIELD OF THE INVENTION

The present invention relates to an IC socket which is used to connect PGA (pin grid array) ICs (integrated circuits) that have pin contacts arranged in the form of a matrix to circuit boards.

BACKGROUND OF THE INVENTION

Ordinarily, IC sockets which are used to connect PGA ICs that have pin contacts arranged in the form of a matrix to circuit boards have numerous contacts. BGA (Ball Grid Array) sockets have been developed in which solder balls attached to the respective contacts are soldered to the circuit board by being heated all at one time.

Here, an epoxy resin containing glass fibers is widely used as the resin that forms the circuit board, and an insulating resin such as a PBT (polybutylene terephthalate) is commonly used for the housing that holds the contacts. However, since these two resins have different linear expansion coefficients, a load is applied to the solder balls after the IC socket is mounted on the circuit board, and this causes solder cracking, resulting in electrical discontinuities between the IC and the circuit board. Furthermore, as a result of the difference in linear expansion coefficients, warping tends to occur in the connector main body and board, and when stress is applied to the soldered parts as a result of this warping, there is a danger of breaking of the electrical continuity.

Accordingly, a technique in which thermal expansion and thermal contraction absorbing parts are formed in the housing is disclosed in the invention of Japanese Patent Application Kokai No. S62-37887. In this application slits 150a which extend from one wall part toward the interior of the housing 120 in the short direction of the housing 120, and slits 150b which have the same depth as the slits 150a and which extend from the other wall part toward the interior of the housing 120, are alternately formed between specified rows of contacts 130 as shown in FIG. 6(A). Slots 151 which are larger than the diameter of the contacts 130 are formed between specified rows of contacts 130 as shown in FIG. 6(B).

As a result of, the difference in linear expansion coefficient between the housing and the board is absorbed, so that solder cracking tends not to occur. Furthermore, warping of the connector and board also tends not to occur.

However, the slits 150a and 150b and slots 151 are formed so that they pass entirely through the housing 120 from the upper surface to the lower surface. Not only is the strength of the housing 120 compromised, but the flow of the synthetic resin that constitutes the molding material is poor when the housing 120 is molded, so that it is difficult to manufacture a housing that has the desired shape.

SUMMARY

Accordingly, an object of the present invention is to provide an IC socket which can prevent the occurrence of solder cracking and warping by absorbing the difference in linear expansion coefficient between the housing and board without lowering the strength of the housing.

In order to address theses problems, an IC socket is provided in which contact receiving cavities accommodate the securing sections of contacts arranged in the a matrix. The cavities pass through the upper and lower surfaces of a housing. Pin receiving openings are formed in the upper surfaces of the contact receiving cavities. Solder ball receiving cavities are formed in the lower surfaces of the contact receiving cavities, so that these pin receiving openings and solder ball receiving cavities are opened wider than the contact receiving cavities. This IC socket further featuring first slits which have a bottom, and which extend from the upper surface of the housing toward the undersurface of the housing, between specified rows of the pin receiving openings. Second slits having a bottom, and extending from the undersurface of the housing toward the upper surface of the housing, are formed between specified rows of the solder ball receiving cavities in positions where the first slits are not formed.

BRIEF DESCRIPTION OF THE DRAWINGS

FIG. 1 shows the IC socket of the present invention.

FIG. 3 shows the IC socket of the present invention.

FIG. 5 shows the housing used in the IC socket of the present invention.

FIG. 6 shows conventional housings.

DETAILED DESCRIPTION OF THE PREFERRED EMBODIMENT

Figure 1A:
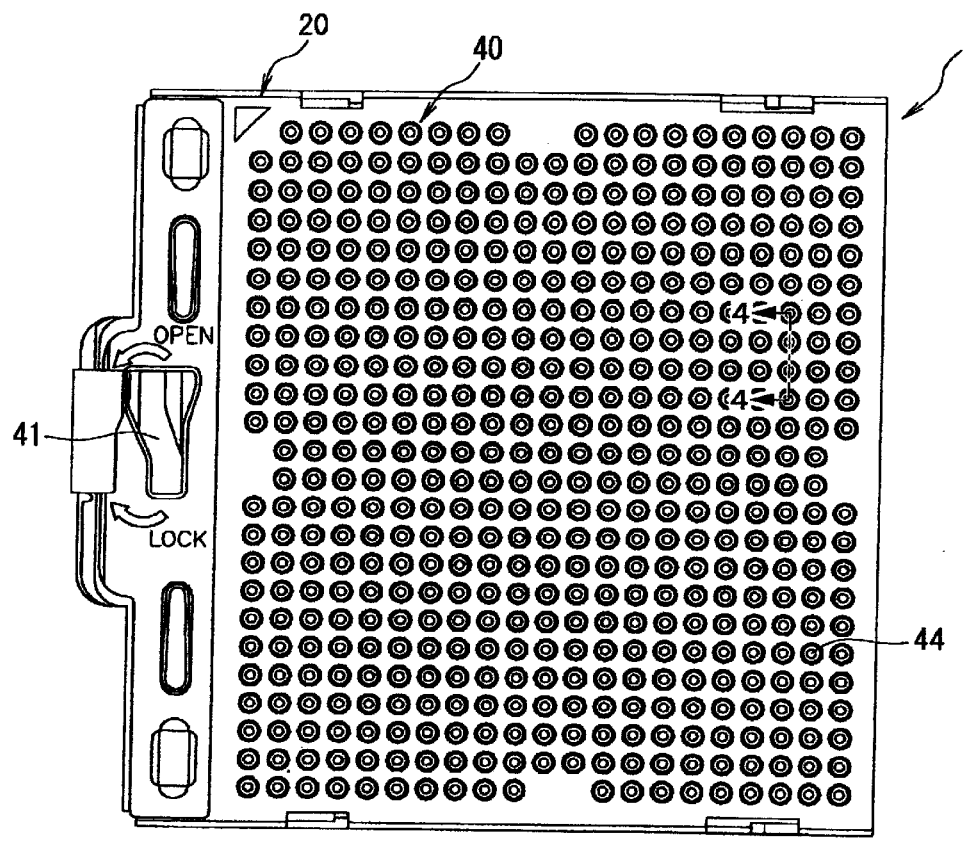
FIG. 1(A) is a plan view.

An embodiment of the present invention will be described below with reference to the attached figures.

As is shown in FIGS. 1 through 4, the IC socket 1 of the present invention is formed from a housing 20 on which a plurality of contacts 30 that are connected to a circuit board (not shown in the figures) via solder balls 33 are arranged in the form of a matrix. A slider 40 can slide in the left-right direction over the upper surface of the housing 20, and an IC (not shown in the figures) is mounted thereon. A tool insertion hole 41 receives a tool (not shown in the figures) that is used to urge the slider 40 to slide to the left or right.

Here, as is shown in FIGS. 5(A) through 5(D), the housing 20 is a substantially rectangular body which is formed by molding an insulating resin such as a PBT. Two projections 23 which are spaced at a specified distance protrude from each of the front and rear walls 22 of the housing 20. Furthermore, a gate 21 which is used to allow the molding material to flow in is left on the right wall 24 of the housing 20. However, this gate 21 is broken off and removed after the IC socket 1 has been connected to the circuit board.

Figure 4:
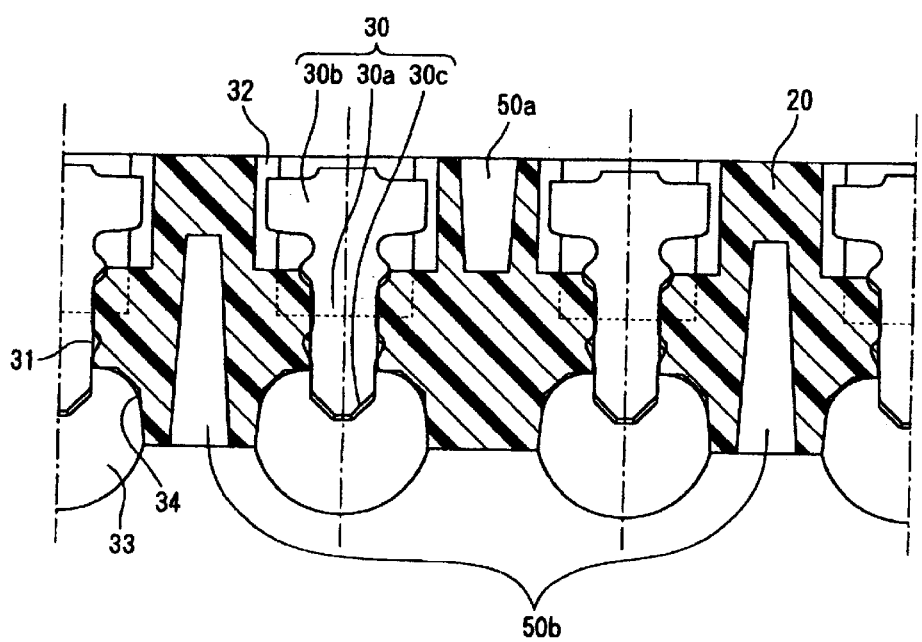
FIG. 4 is a partial enlarged sectional view along plane 4—4 in FIG. 1(A), showing a state in which the slider is removed.

As is shown in FIG. 4, a plurality of press-fitted contacts 30 are arranged in the form of a matrix and pass entirely through the housing 20 from the upper surface to the lower surface. Pin receiving openings 32 (not shown in the figures) are formed on the IC in the upper surfaces of contact receiving cavities 31, and solder ball receiving cavities 34 are formed in the lower surfaces of the contact securing sections accommodating holes 31, so that these pin receiving openings 32 and solder ball receiving cavities 34 are opened wider than the contact receiving cavities 31.

Figure 3A:
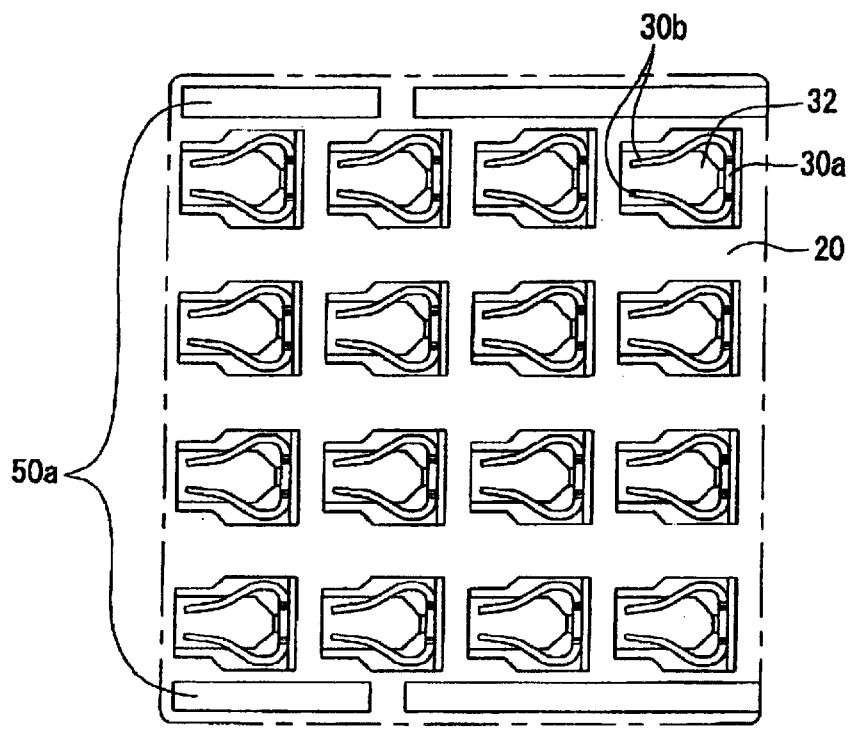
FIG. 3(A) is a partial enlarged plan view showing a state in which the slider is removed in FIG. 1(A)
Figure 5A:
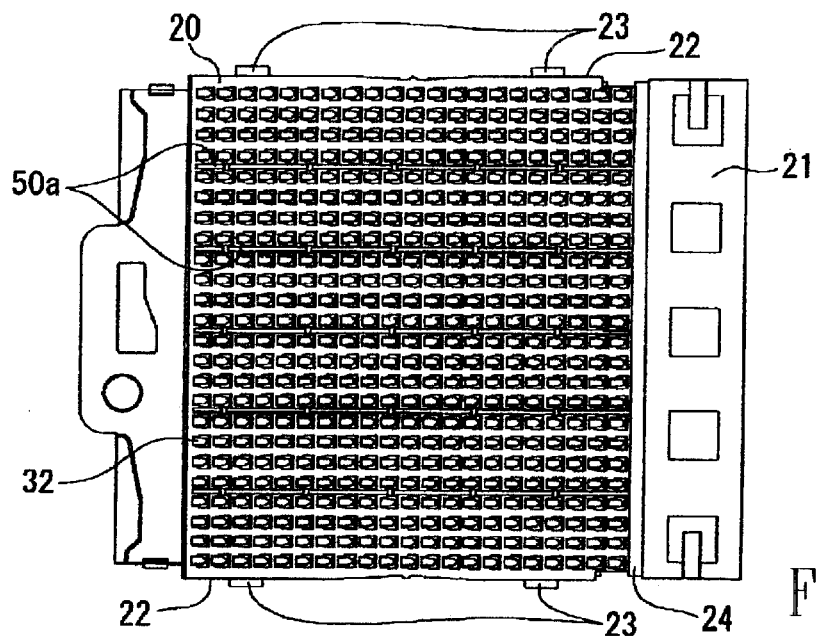
FIG. 5(A) is a plan view.
Figure 5B:
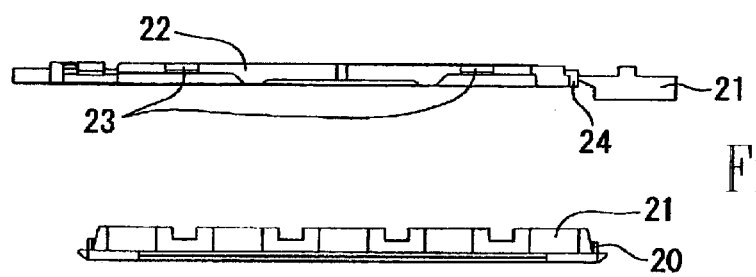
FIG. 5(B) is a front view.
Figure 5C:
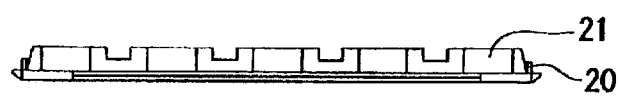
FIG. 5(C) is a right-side view.

As is shown in FIG. 5(A), a plurality of first slits 50a which have bottoms are formed between specified rows of the pin receiving openings 32 formed in the upper surface of the housing 20, at least across the region in which the contacts 30 are press-fitted. These first slits 50a are not formed in continuous straight lines, but are instead interrupted at certain points. Here, as is shown in FIG. 3(A), a slit 50a is formed for every four rows of pin receiving openings 32.

Figure 3B:
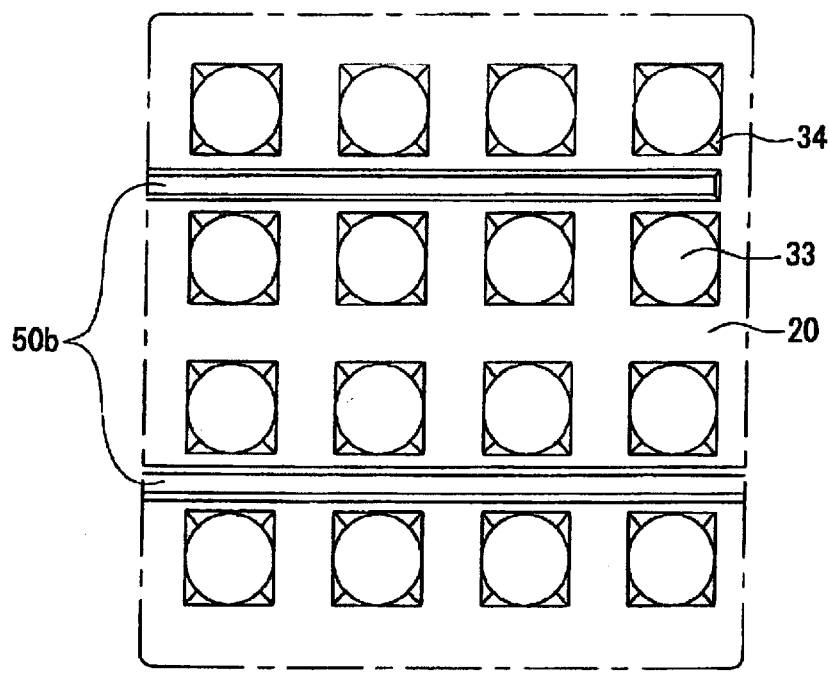
FIG. 3(B) is a partial enlarged back view of FIG. 2.
Figure 5D:
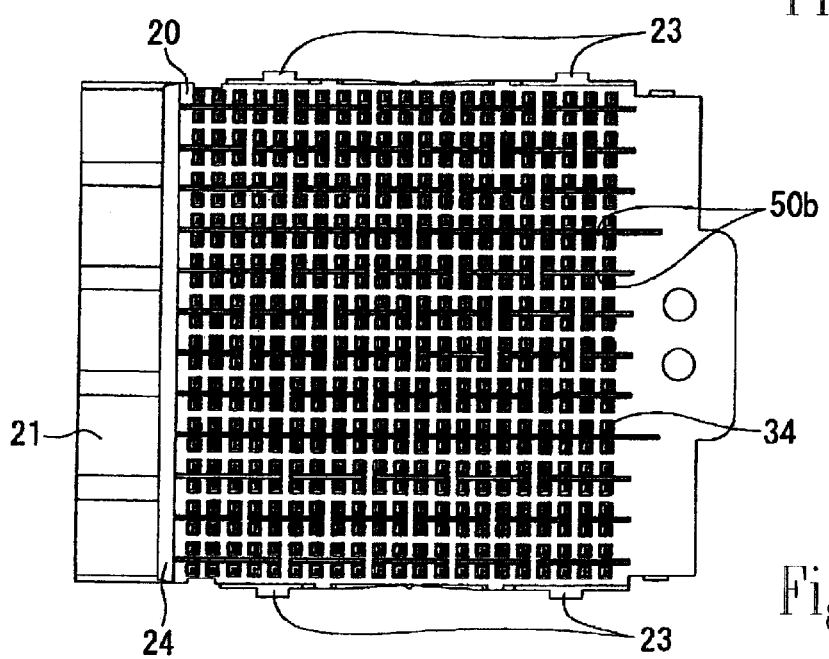
FIG. 5(D) is a back view.
Figure 6A:
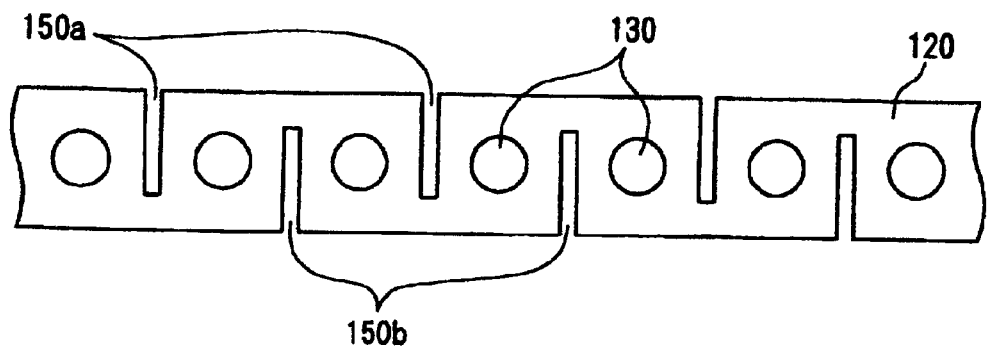
FIG. 6(A) is a plan view which shows one conventional example.
Figure 6B:
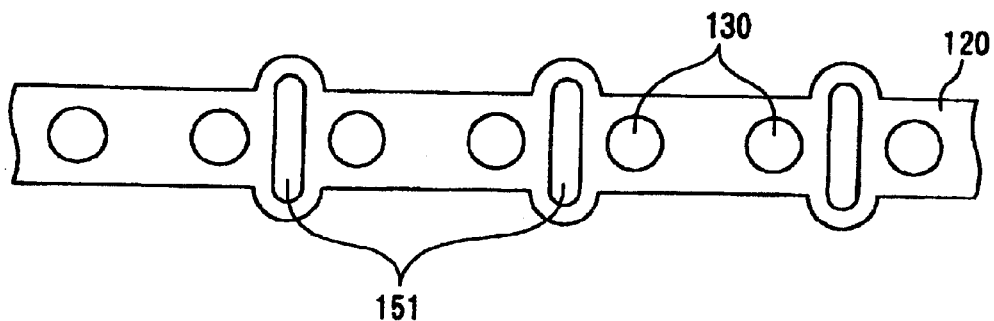
FIG. 6(B) is a plan view which shows another conventional example.

As is shown in FIG. 5(D), a plurality of second slits 50b which have bottoms are formed between specified rows of the solder ball receiving cavities 34 formed in the undersurface of the housing 20, at least across the region in which the contacts 30 are press-fitted. Like the first slits 50a, these second slits 50b are not formed in continuous straight lines in the left-right direction, but are instead interrupted at certain points. Here, as is shown in FIG. 3(B), a slit 50b is formed for every two rows of solder ball receiving cavities 34. The first slits 50a and second slits 50b are formed so that they do not overlap with each other.

As is shown in FIG. 4, the first slits 50a formed in the upper surface of the housing 20 are cut in toward the undersurface of the housing 20 from the upper surface of the housing 20, and the depth of these first slits 50a is approximately the same as that of the bottom surfaces of the pin receiving openings 32. In other words, cuts are formed to a depth that is equal to approximately four-tenths of the thickness of the housing 20. Furthermore, the second slits 50b formed in the undersurface of the housing 20 are cut in toward the upper surface of the housing 20 from the undersurface of the housing 20, and the depth of these second slits 50b extends to a point that is higher than the bottom surfaces of the pin receiving openings 32. In other words, cuts are formed to a depth that is equal to approximately seven-tenths of the thickness of the housing 20. Here, since slits 50a and 50b which have bottoms, and which thus do not pass entirely through the housing 20 from the upper surface to the lower surface, are formed so that, the strength of the housing 20 can be maintained.

The cut-in depths of the first slits 50a and second slits 50b are different, with the first slits 50a having a shallower cut-in depth than the second slits 50b. This is done in order to reduce the skewing of the distribution of the molding material between the upper part of the housing 20 and lower part of the housing 20. As a result, warping of the housing 20 can be effectively prevented.

The contacts 30 are formed by stamping and forming techniques. As is shown in FIG. 4, each contact 30 is constructed from a press-fitting part 30a which is press-fitted in the corresponding contact press-fitting part accommodating hole 31 of the housing 20, an elastic contact part 30b which can accommodate and contact a pin contact, and a solder ball connection part 30c which extends downward from the press-fitting part 30a, and to which a solder ball is connected. Here, as is shown in FIG. 3(A), the elastic contact part 30b constitutes a pair of elastic contact pieces which protrude toward the left from the upper end of the press-fitting part 30a. The width formed by the pair of elastic contact pieces on the side of the press-fitting part 30a is set so that this width is relatively large, while the width on the left side which is removed from the press-fitting part 30a is set so that this width is relatively small. Accordingly, when the pin contacts are positioned on the right sides of the contacts 30 (i.e., the sides of the securing sections 30a), no contact occurs, so that the IC can be inserted or removed without the application of any load. On the other hand, when the pin contacts are positioned on the left sides of the contacts 30, the pin contacts contact the elastic contact part 30b.

Figure 1B:
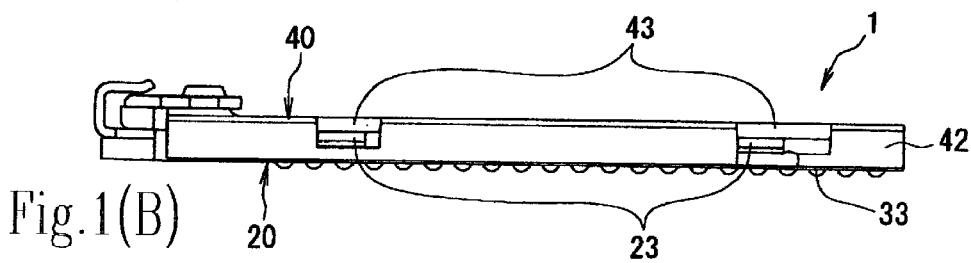
FIG. 1(B) is a front view.
Figure 1C:
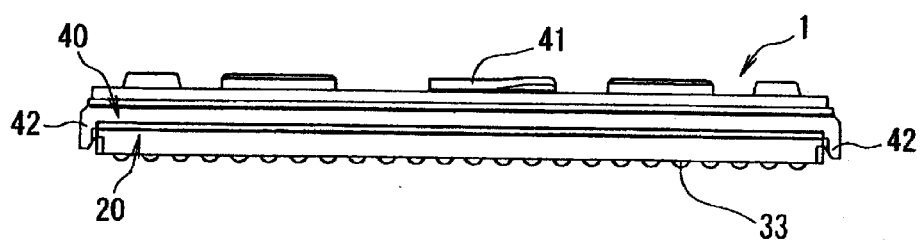
FIG. 1(C) is a right-side view.
Figure 2:
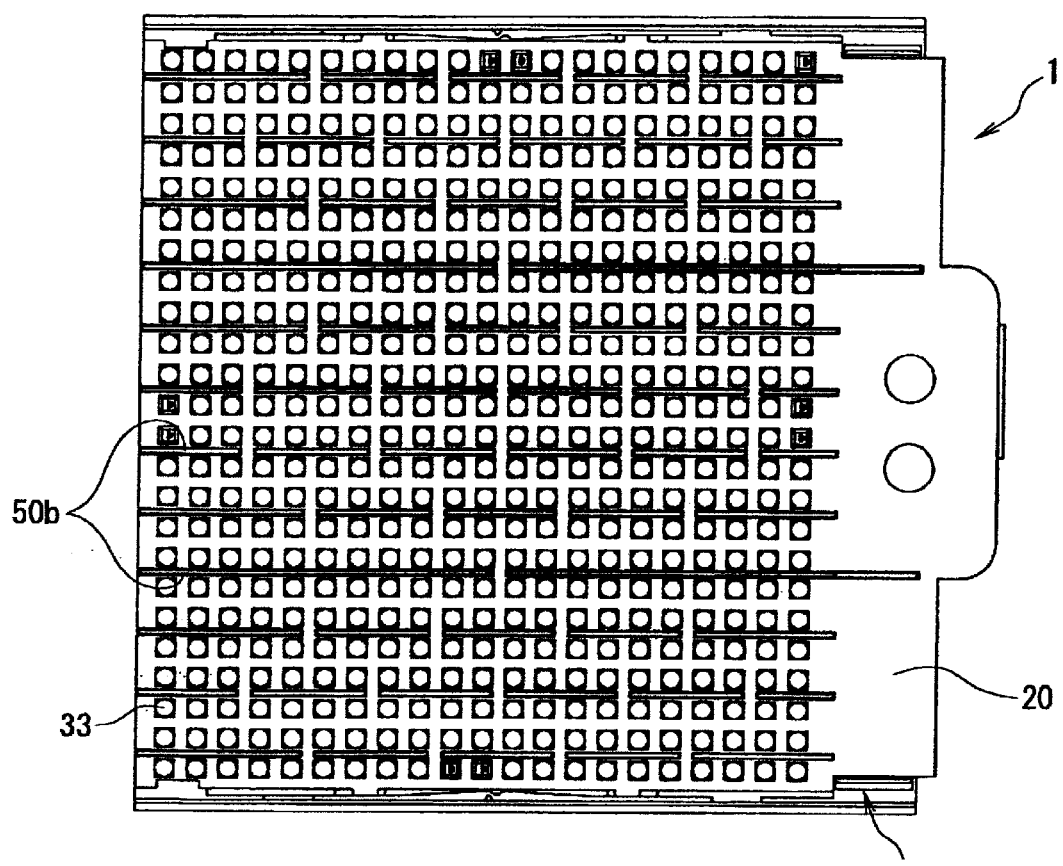
FIG. 2 is a view of the back surface of the IC socket shown in FIG. 1(A).

As shown in FIGS. 1(A) through 1(C), the slider 40 is formed by molding an insulating resin such as a PBT, and is a substantially rectangular body which has substantially the same dimensions as the housing 20. Furthermore, this slider 40 is equipped with front and back walls 42 which extend from the front and back sides. Openings 43 are formed in these front and back walls 42 in positions corresponding to the projections 22 formed on the housing 20, so that the projections 22 can move to the left and right only within the range of these openings. Accordingly, the slider 40 can slide to the left and right, and the projections 22 and openings 43 also act to prevent the slider 40 from slipping out of the housing 20 in an upward direction.

As shown in FIG. 1(A), a tool insertion hole 41 which is used to move the slider 40 to the left and right is formed in the left side of the housing 20. This tool insertion hole 41 is constructed so that when the tool inserted into the tool insertion hole 41 is rotated in the "lock" direction, the slider 40 moves to the left. When the tool is rotated in the "open" direction, the slider 40 moves to the right. Pin receiving openings 44 are disposed in the form of a matrix so that these openings 44 correspond to the contacts 30 formed in the housing 20.

Next, the manufacture of the IC socket 1 and the method used to connect the IC socket 1 and the circuit board will be described. First, as is shown in FIG. 5(A), the resin that constitutes the molding material of the housing 20 that forms the IC socket 1 is injection-molded to flow in via the gate 21. Here, as is shown in FIG. 4, the contact receiving cavities 31, pin receiving openings 32, solder ball receiving cavities 34, first slits 50a and second slits 50b are formed in the housing 20. Afterward, the securing sections 30a of the contacts 30 are press-fitted in the contact receiving cavities 31. Solder balls 33 are then formed in the solder ball receiving cavities 34, and the solder balls are attached to the solder ball connection parts 30c.

Similarly, the slider 40 is also formed by injection-molding. Here, the pin receiving openings 44 are formed in the form of a matrix so that these openings 44 correspond to the contacts 30 formed in the housing 20. The IC socket 1 is completed by attaching the slider 40 to the upper surface of the housing 20 so that the slider 40 can slide to the left and right.

Then, the IC socket 1 is connected to the circuit board by heating all of the solder balls 33 formed on the undersurface of the housing 20 at one time. Here, the gate 21 utilized in the injection-molding of the housing 20 is left in an attached state in order to prevent warping of the housing 20 caused by the heat generated during soldering. This gate 21 is then broken off after soldering is completed.

In order to make electrical connections between the pin contacts formed on the IC and the circuit board utilizing this IC socket 1, the tool is rotated in the "lock" direction, so that the slider 40 is moved to the left. As a result, the pin contacts contact the elastic contact parts 30b of the contacts 30, so that electrical continuity is established.

On the other hand, if the tool is rotated in the "open" direction so that the slider 40 is moved to the right, the contact between the pin contacts and the elastic contact parts 30b is broken.

Here, stress applied to the solder balls 33 as a result of the difference in linear expansion coefficient between the housing 20 and circuit board can be prevented by the simple construction of forming slits 50a and 50b, which have bottoms and which are used to absorb the difference in linear expansion coefficient, in the housing 20. Accordingly, solder cracking can be reliably prevented after the IC socket 1 has been mounted on the circuit board.

Furthermore, the warping following molding can be adjusted by varying the depth, number and positions, etc., of the slits 50. Accordingly, the advantage of easy quality control is also obtained.

Furthermore, as long as the slider 40 is a part that can slide to the left and right, the construction of the slider is not limited to the tool insertion hole 41 and tool shown in the present embodiment. For example, it would also be possible to drive the slider using a cam shaft, which makes sliding possible by a rotating operation.

Furthermore, in the present embodiment, an IC socket 1 which used a slider 40 to allow easy connection of the pin contacts formed on an IC to the circuit board was described, however, it would also be possible to obtain a similar effect in a case where the pin contacts are directly connected to the housing 20 in a state in which the slider 40 is removed.

Furthermore, as long as the cut-in depths of the first slits 50a and second slits 50b are formed so that the distribution of the molding material is not skewed between the upper part and lower part of the housing 20, the construction of these slits is not limited to that of the present embodiment. As long as the first slits 50a and second slits 50b are formed so that these slits do not overlap, the number and positions of the slits 50 are likewise not limited to those shown in the present embodiment.

Advantageously, first slits which are formed between specified rows of the pin receiving openings formed in the upper surface of the housing, and second slits which are formed between specified rows of the solder ball receiving cavities formed in the undersurface of the housing, are formed so that these respective slits do not overlap with each other. As a result, the difference in linear expansion coefficient between the housing and the board can be absorbed, so that the occurrence of solder cracking and warping can be prevented.

Furthermore, as a result of the formation of first slits and second slits which have bottoms, the strength of the housing can be maintained. This is also effective in improving the flow of the molding material during the molding of the housing, so that a housing with a desired shape can easily be manufactured.

Accordingly, an IC socket which is highly reliable in terms of electrical continuity can be formed without lowering the strength of the housing.

What is claimed is:

1. An IC socket housing having a plurality of pin receiving openings and solder ball receiving cavities formed in respective contact receiving cavities extending through an upper surface and an undersurface of the socket housing comprising:
    first slits being open at the upper surface of the housing and extending partially into the housing between first specified rows of the contact receiving cavities, and
    second slits being open at the undersurface of the housing and extending partially into the housing between second specified rows of the contact receiving cavities.

2. The IC socket housing of claim 1 wherein the first slits extend into to housing to a first depth and the second slits extend into the housing to a second depth.

3. The IC socket housing of claim 1 wherein the first depth is more shallow than the second depth.

4. An IC socket in which contact receiving cavities which accommodate the securing sections of contacts used to connect ICs to a circuit board are arranged in the form of a matrix in which the holes pass through the upper and lower surfaces of a housing, pin receiving openings which are used to accommodate pin contacts formed on the ICs are formed in the upper surfaces of the contact receiving cavities, and solder ball receiving cavities which are used to accommodate solder balls that are used for connection to the circuit board are formed in the lower surfaces of the contact receiving cavities, so that the pin receiving openings and solder ball receiving cavities are opened wider than the contact receiving cavities; the IC socket comprising:
    first slits which have a bottom, and which extend from the upper surface of the housing toward the undersurface of the housing, being formed between specified rows of the pin receiving openings, and
    second slits which have a bottom, and which extend from the undersurface of the housing toward the upper surface of the housing, being formed between specified rows of the solder ball receiving cavities in positions where the first slits are not formed.

5. The IC socket of claim 4, which wherein the first slits are formed with a shallower depth than the second slits.

6. The IC socket of claim 4 further comprising a slider positioned over the housing, the slider being actuateable to urge the pin contacts of an inserted IC against pin receiving contacts located in the pin receiving openings.

7. The IC socket of claim 4 wherein the first and second slits are located to prevent warping of the housing upon thermal cycling.

8. The IC socket of claim 7 wherein the first and second slits are located to prevent cracking of solder ball connections on the underside of the housing.

* * * * *